US009111918B2

(12) United States Patent
Yang et al.

(10) Patent No.: US 9,111,918 B2
(45) Date of Patent: Aug. 18, 2015

(54) FIN FABRICATION PROCESS FOR ENTRAINMENT HEAT SINK

(75) Inventors: Wei Yang, Minnetonka, MN (US);
Leonard Hilton, Buffalo, MN (US);
Yuandong Gu, Plymouth, MN (US);
Jong Park, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 911 days.

(21) Appl. No.: 12/955,449

(22) Filed: Nov. 29, 2010

(65) Prior Publication Data

US 2012/0131979 A1    May 31, 2012

(51) Int. Cl.
| | | |
|---|---|---|
| *H01L 21/48* | (2006.01) | |
| *B21D 53/04* | (2006.01) | |
| *B21D 22/04* | (2006.01) | |
| B21D 19/08 | (2006.01) | |
| B21D 31/02 | (2006.01) | |
| H01L 23/467 | (2006.01) | |
| H05K 7/20 | (2006.01) | |

(52) U.S. Cl.
CPC ............ *H01L 21/4878* (2013.01); *B21D 22/04* (2013.01); *B21D 53/04* (2013.01); *B21D 19/08* (2013.01); *B21D 31/02* (2013.01); *H01L 23/467* (2013.01); *H01L 2924/0002* (2013.01); *H01L 2924/00013* (2013.01); *H05K 7/20563* (2013.01); *Y10T 29/49826* (2015.01)

(58) Field of Classification Search
CPC ............ H01L 21/4878; H01L 23/3672; H01L 23/467; H01L 21/4882; B21D 53/04; B21D 22/04
USPC ........ 72/363, 343, 324, 325, 379.2, 335, 348; 165/80.3, 104.34, 46; 29/890.03, 29/890.039
See application file for complete search history.

(56) References Cited

U.S. PATENT DOCUMENTS

| | | | |
|---|---|---|---|
| 4,296,455 A | 10/1981 | Leaycraft et al. | |
| 4,417,295 A | 11/1983 | Stuckert | |
| 4,800,956 A | 1/1989 | Hamburgen | |
| 4,851,965 A | 7/1989 | Gabuzda et al. | |
| 5,361,188 A | 11/1994 | Kondou et al. | |
| 5,428,503 A | 6/1995 | Matsushima et al. | |
| 5,560,424 A * | 10/1996 | Ogawa ......................... | 165/183 |
| 5,731,954 A | 3/1998 | Cheon | |

(Continued)

OTHER PUBLICATIONS

"U.S. Appl. No. 13/207,062, Response filed Nov. 24, 2014 to Restriction Requirement mailed Nov. 17, 2014", 7 pgs.

(Continued)

*Primary Examiner* — Shelley Self
*Assistant Examiner* — Mohammad I Yusuf
(74) *Attorney, Agent, or Firm* — Schwegmann Lundberg & Woessner, P.A.

(57) ABSTRACT

A process to fabricate a fin for a heat sink includes creating an array of micro diameter holes on a substrate, and then coupling the substrate to a mold. The mold includes angular dimples such that one or more of the micro diameter holes on the substrate come into contact with the angular dimples in the mold, thereby forming an angle between the micro diameter holes and a surface of the substrate. The process further includes placing the substrate onto a plate. The plate includes micro air channels such that the micro air channels are in communication with the micro diameter holes. In another embodiment, two pieces of substrate, each with micro diameter holes and embossed micro air channels are coupled together to form a fin.

10 Claims, 5 Drawing Sheets

(56) References Cited

U.S. PATENT DOCUMENTS

| | | | |
|---|---|---|---|
| 6,131,646 A * | 10/2000 | Kelley | 165/80.3 |
| 6,352,103 B1 | 3/2002 | Chu et al. | |
| 6,373,696 B1 | 4/2002 | Bolognia et al. | |
| 6,378,605 B1 | 4/2002 | Kutscher et al. | |
| 6,538,885 B1 | 3/2003 | Azar | |
| 6,538,892 B2 | 3/2003 | Smaic | |
| 6,587,336 B2 | 7/2003 | Chu et al. | |
| 6,622,785 B2 * | 9/2003 | Haegele et al. | 165/177 |
| 6,684,942 B2 | 2/2004 | Song et al. | |
| 6,765,796 B2 | 7/2004 | Hoffman et al. | |
| 6,781,834 B2 | 8/2004 | Nair et al. | |
| 6,817,405 B2 | 11/2004 | Kamath et al. | |
| 6,886,249 B2 | 5/2005 | Smalc | |
| 6,918,438 B2 | 7/2005 | Ellsworth, Jr. et al. | |
| 7,000,427 B2 | 2/2006 | Mathias et al. | |
| 7,222,423 B2 | 5/2007 | Ellsworth, Jr. et al. | |
| 7,284,596 B2 | 10/2007 | Larson | |
| 8,376,031 B2 * | 2/2013 | Yang et al. | 165/80.3 |
| 2002/0069661 A1 | 6/2002 | Livni | |
| 2009/0288807 A1 | 11/2009 | Yang et al. | |
| 2012/0132410 A1 | 5/2012 | Gu et al. | |

OTHER PUBLICATIONS

"U.S. Appl. No. 13/207,062, Restriction Requirement mailed Nov. 17, 2014", 7 pgs.

* cited by examiner

FIN FABRICATION PROCESS FOR ENTRAINMENT HEAT SINK

GOVERNMENT RIGHTS

This invention was made with United States Government support under Contract Number W31PQ4-09-C-0042. The United States Government has certain rights in this invention.

TECHNICAL FIELD

The present disclosure relates to a fin fabrication process for an entrainment heat sink.

BACKGROUND

In densely packed electronic systems, heat dissipation is a big challenge due to space constraints that preclude convective thermal solutions involving blowers or fans in proximity to the heat sources. For example, avionics systems with densely packed printed board assemblies (PBA), in which conventional onboard fans/blowers are too bulky to be placed, typically rely on conductive heat sinks made of solid metal plates. However, these solid metal plates are heavy and have limited performance capability.

DETAILED DESCRIPTION

This disclosure describes a method to fabricate fins for heat sinks, and in an embodiment, entrainment heat sinks. An entrainment heat sink is driven by compressed air, can be made in extremely low-profile, and thus is able to bring convective cooling to tight spaces previously only addressable by conductive cooling methods. The fins for the entrainment heat sink differ from conventional extruded structures in that they must contain micro air flow channels and nozzles that direct air jets predominately parallel to the fin surface and in the direction of the desired bulk air flow. The micro nozzles are connected via micro air channels that facilitate compressed air delivery. In an embodiment, the micro nozzles are fabricated on a substrate such as a metal foil and may be laminated on a plate, such as a metal plate, to form a fin. Other materials that can be used alone or in combination include various metals, graphite, ceramics, polymers, and composites. The micro air channels can be formed at the interface between the metal foil and the metal plate. In another embodiment, two layers of metal foil may be laminated together. Micro air channels are embossed on each of the metal foil layers.

Figure 1:
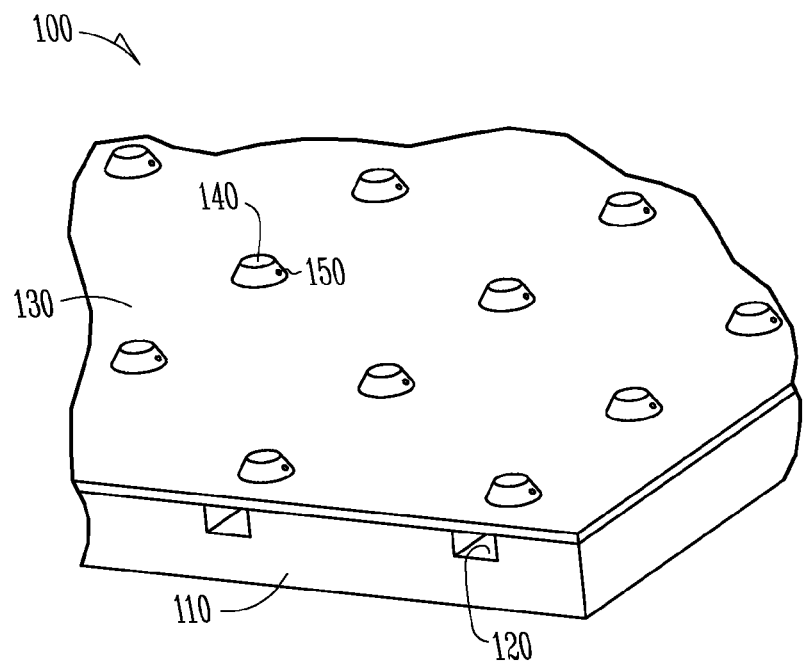
FIG. 1 is a perspective view an example embodiment of a heat sink including fabricated fins on a metal plate.
Figure 2:
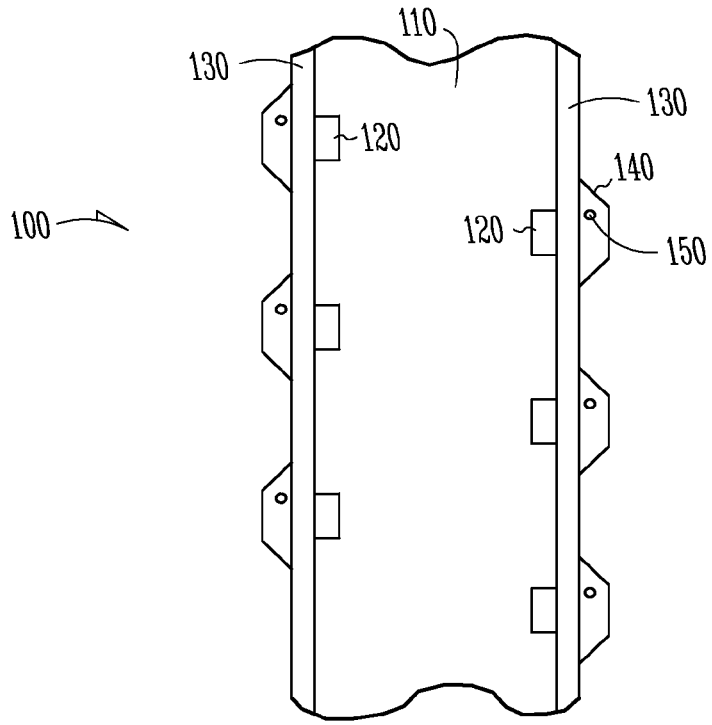
FIG. 2 is a side view of another example embodiment of a heat sink including fabricated fins on two sides of a metal plate.
Figure 3:
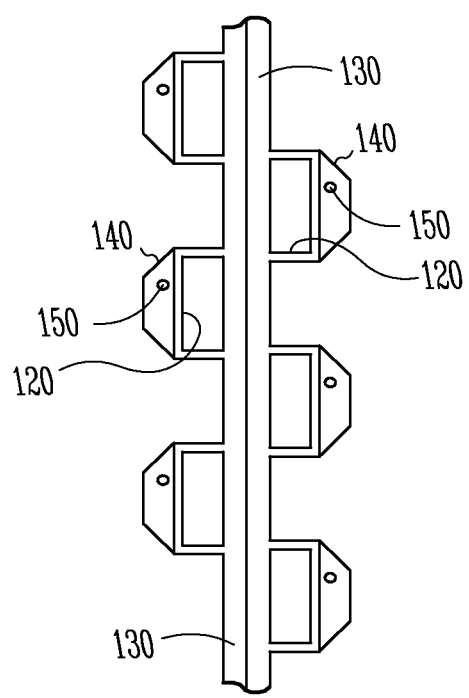
FIG. 3 is a side view of another example embodiment of a heat sink including two fabricated fins coupled together.

FIG. 1 illustrates an example embodiment of such a heat sink and fin combination. The heat sink 100 includes a metal plate 110 that includes micro air channels 120. A metal foil 130 is placed on the metal plate 110. The metal foil 130 includes angular dimples 140 that include on their angular faces air nozzles 150. FIG. 2 is a side view of such a heat sink and fin combination 100, and illustrates that micro air channels can be positioned on both sides of the metal plate 110 and that a metal foil 130 can be placed on both sides of the metal plate 110. FIG. 3 is a side view of another embodiment that includes two layers of metal foil 130 laminated to each other, with micro air channels 120 embossed on each layer and in communication with one or more angular dimples 140 with air nozzles 150.

The fabrication process starts by creating micro diameter holes on a metal foil using for example chemical etching, a laser, or electric discharge machining (EDM). In an embodiment, the metal foil is a copper foil. The copper foil has high thermal conductivity and is amenable to continuous variation of the jet angle. Other drilling methods such as sandblasting, the use of ultrasonic waves, a water jet, or micro milling/drilling machines can be used as well. The EDM method is generally preferred because of better precision and uniformity. These holes form the micro nozzles without specified orientations. The holes are approximately 20-50 micrometers in diameter. The nozzle orientation is created after the EDM drilling by stamping trapezoidal dimples in a mold. In an embodiment, the mold is a steel mold. In the stamping process the EDM hole is placed on the slanted side walls of the dimple, creating an angle from the fin base. Dimple side walls are slanted from 5 to 30 degrees from the vertical (or 60 to 85 degrees from the fin surface) in different sets of molds, thus giving various jet angles (polar). This method also allows azimuth control and allows continuous variation of the jet angles.

The metal foil that contains the micro nozzles can be laminated to a metal plate or another foil with similar micro nozzles. Micro-air channels, for the purpose of delivering compressed air, are formed at the interface of the lamination by, for example, machining, forming, embossing, or chemical etching trenches on the metal plate or the foil, and forming enclosed channels after lamination.

This fin fabrication process can be used to make entrainment heat sinks that have numerous application opportunities in high performance thermal management systems. Because such fins enable extremely low profile heat sinks, it is particularly suitable for space-constrained applications such as avionic systems with densely packed printed board assemblies (PBA) wherein conventional onboard fan/blowers are too bulky to fit.

In an embodiment, the copper foil after the dimple/nozzle formation is laminated onto a copper core which is about 0.5 mm thick and contains air channels that are in fluidic connection with the nozzle arrays. The fins may have nozzles on one side or both sides of the core. The fins can be fabricated in standard 1"×4" format and cut into various lengths according to specific heat sink designs.

Figure 4:
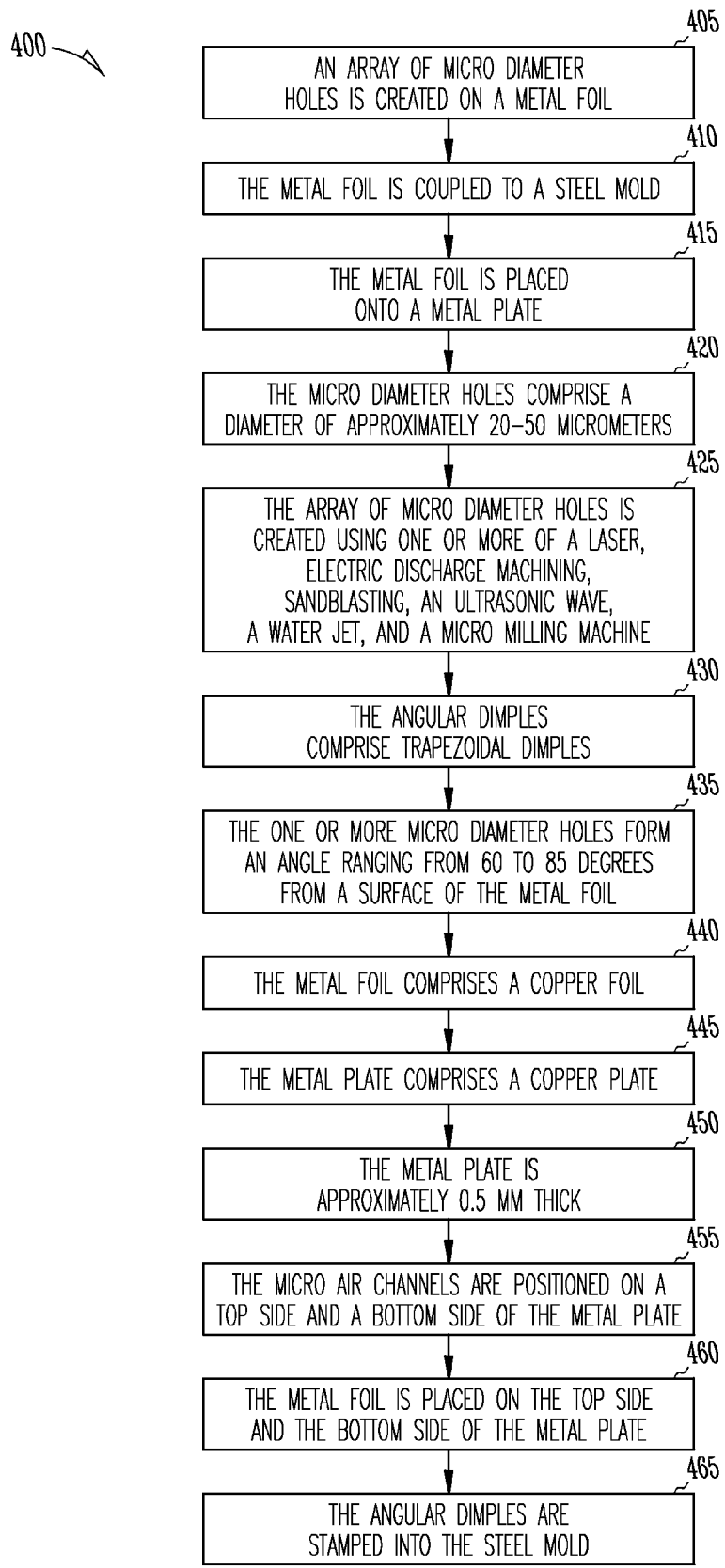
FIG. 4 is a flowchart of an example process to manufacture a heat sink.
Figure 5A:
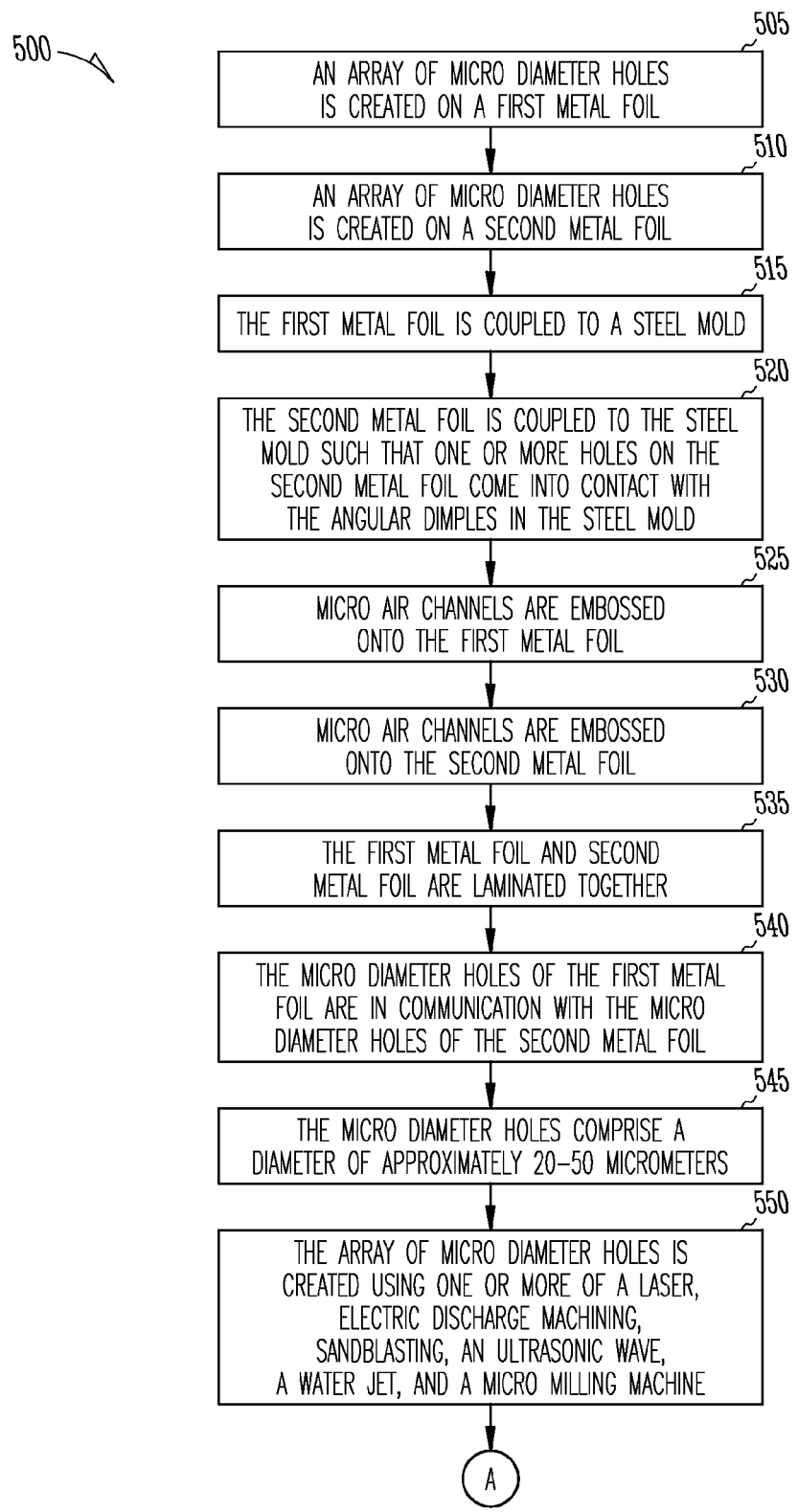
FIGS. 5A and 5B are a flowchart of another example process to manufacture a heat sink.
Figure 5B:
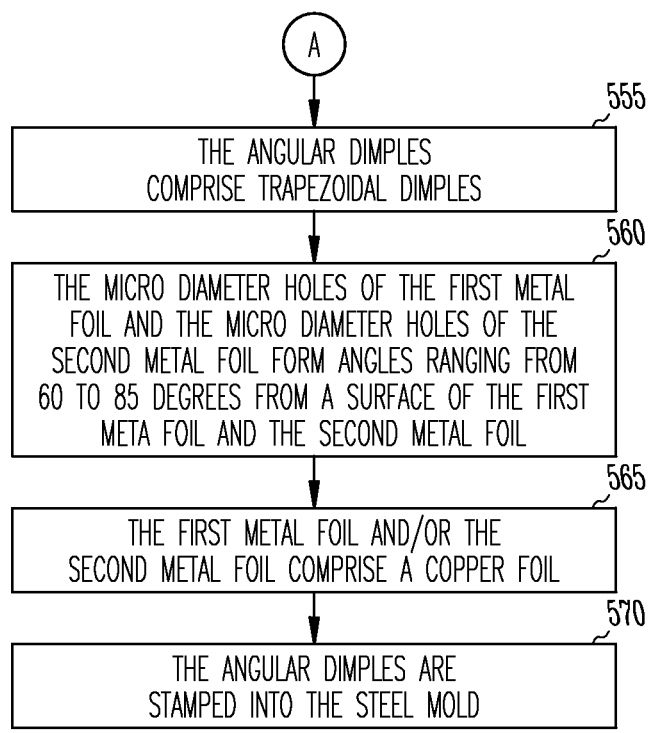

FIGS. 4 and 5 are flowcharts of example processes 400 and 500 for forming fins for an entrainment heat sink. FIGS. 4 and 5 include a number of process blocks 405-465 and 505-570 respectively. Though arranged serially in the examples of FIGS. 4 and 5, other examples may reorder the blocks, omit one or more blocks, and/or execute two or more blocks in parallel using multiple processors or a single processor organized as two or more virtual machines or sub-processors. Moreover, still other examples can implement the blocks as one or more specific interconnected hardware or integrated circuit modules with related control and data signals communicated between and through the modules. Thus, any process flow is applicable to software, firmware, hardware, and hybrid implementations.

Referring to FIG. 4, at 405, an array of micro diameter holes is created on a metal foil. At 410, the metal foil is coupled to a mold. The mold includes angular dimples such that one or more of the micro diameter holes on the metal foil come into contact with the angular dimples in the mold. This stamping of the metal foil with the mold forms an angle between the micro diameter holes and a surface of the metal foil. At 415, the metal foil is placed onto a metal plate. The metal plate includes micro air channels, and the micro air channels are in communication with the micro diameter holes.

At 420, the micro diameter holes comprise a diameter of approximately 20-50 micrometers. At 425, the array of micro diameter holes is created using one or more of a laser, electric discharge machining, sandblasting, an ultrasonic wave, a water jet, and a micro milling machine. At 430, the angular dimples comprise trapezoidal dimples. At 435, the one or more micro diameter holes form an angle ranging from 60 to 85 degrees from a surface of the metal foil. At 440, the metal foil comprises a copper foil, at 445, the metal plate comprises a copper plate, and at 450, the metal plate is approximately 0.5 mm thick. At 455, the micro air channels are positioned on a top side and a bottom side of the metal plate. At 460, the metal foil is placed on the top side and the bottom side of the metal plate. At 465, the angular dimples are stamped into the mold.

Referring to FIG. 5, at 505, an array of micro diameter holes is created on a first metal foil, and at 510, an array of micro diameter holes is created on a second metal foil. At 515, the first metal foil is coupled to a mold. The mold includes angular dimples such that one or more holes on the first metal foil come into contact with the angular dimples in the mold. This contact forms an angle between the holes on the first metal foil and a surface of the first metal foil. At 520, the second metal foil is coupled to the mold such that one or more holes on the second metal foil come into contact with the angular dimples in the mold. As with the first metal foil, this contact forms an angle between the holes of the second metal foil and a surface of the second metal foil. At 525, micro air channels are embossed onto the first metal foil. The micro air channels in the first metal foil are in communication with the micro diameter holes in the first metal foil. Similarly, at 530, micro air channels are embossed onto the second metal foil. The micro air channels in the second metal foil are in communication with the micro diameter holes in the second metal foil. At 535, the first metal foil and second metal foil are laminated together.

At 540, the micro diameter holes of the first metal foil are in communication with the micro diameter holes of the second metal foil. At 545, the micro diameter holes comprise a diameter of approximately 20-50 micrometers. At 550, the array of micro diameter holes is created using one or more of a laser, electric discharge machining, sandblasting, an ultrasonic wave, a water jet, and a micro milling machine. At 555, the angular dimples comprise trapezoidal dimples. At 560, the micro diameter holes of the first metal foil and the micro diameter holes of the second metal foil form angles ranging from 60 to 85 degrees from a surface of the first meta foil and the second metal foil. At 565, the first metal foil and/or the second metal foil comprise a copper foil. At 570, the angular dimples are stamped into the steel mold.

It should be understood that there exist implementations of other variations and modifications of the invention and its various aspects, as may be readily apparent, for example, to those of ordinary skill in the art, and that the invention is not limited by specific embodiments described herein. Features and embodiments described above may be combined with each other in different combinations. It is therefore contemplated to cover any and all modifications, variations, combinations or equivalents that fall within the scope of the present invention.

The Abstract is provided to comply with 37 C.F.R. §1.72(b) and will allow the reader to quickly ascertain the nature and gist of the technical disclosure. It is submitted with the understanding that it will not be used to interpret or limit the scope or meaning of the claims.

The invention claimed is:

1. A process comprising:
    creating an array of micro diameter holes on a flat, planar substrate;
    coupling the flat, planar substrate to a mold, the mold comprising angular dimples such that one or more of the micro diameter holes on the flat, planar substrate come into contact with the angular dimples in the mold, thereby forming an angle between the micro diameter holes and a surface of the flat, planar substrate; and
    placing the flat, planar substrate onto a surface of a flat, planar plate such that the flat, planar substrate and the flat, planar plate are parallel and such that the flat, planar substrate and the flat, planar plate are in contact along the surfaces of the flat, planar substrate and the flat, planar plate, the flat, planar plate comprising micro air channels such that the micro air channels are in communication with the micro diameter holes.

2. The process of claim 1, wherein the micro diameter holes comprise a diameter of approximately 20-50 micrometers.

3. The process of claim 1, comprising creating the array of micro diameter holes using one or more of a laser, electric discharge machining, sandblasting, an ultrasonic wave, a water jet, chemical etching, and a micro milling machine.

4. The process of claim 1, wherein the angular dimples comprise trapezoidal dimples.

5. The process of claim 1, wherein the one or more micro diameter holes form an angle ranging from 60 to 85 degrees from the surface of the flat, planar substrate.

6. The process of claim 1, wherein the flat, planar substrate comprises a copper foil.

7. The process of claim 1, wherein the flat, planar plate comprises a copper plate.

8. The process of claim 1, wherein the flat, planar plate is approximately 0.5 mm thick.

9. The process of claim 1, comprising stamping the angular dimples into the mold.

10. A process comprising:
    creating an array of micro diameter holes on a flat, planar substrate;
    coupling the flat, planar substrate to a mold, the mold comprising angular and circular dimples such that one or more of the micro diameter holes on the flat, planar substrate come into contact with the angular dimples in the mold, thereby forming an angle between the micro diameter holes and a surface of the flat, planar substrate; and
    placing the flat, planar substrate onto a flat, planar plate such that the flat, planar substrate and flat, planar plate are parallel, the flat, planar plate comprising micro air channels such that the micro air channels are in communication with the micro diameter holes.

* * * * *